(12) United States Patent
Endo et al.

(10) Patent No.: US 9,930,814 B2
(45) Date of Patent: Mar. 27, 2018

(54) MODULAR DATA CENTER AND METHOD OF CONTROLLING MODULAR DATA CENTER

(71) Applicant: FUJITSU LIMITED, Kawasaki-shi, Kanagawa (JP)

(72) Inventors: Hiroshi Endo, Isehara (JP); Hiroyoshi Kodama, Isehara (JP); Masatoshi Ogawa, Isehara (JP); Hiroyuki Fukuda, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 517 days.

(21) Appl. No.: 14/706,070

(22) Filed: May 7, 2015

(65) Prior Publication Data
US 2015/0237768 A1 Aug. 20, 2015

Related U.S. Application Data

(63) Continuation of application No. PCT/JP2012/079792, filed on Nov. 16, 2012.

(51) Int. Cl.
*H05K 7/20* (2006.01)
*H05K 7/14* (2006.01)
(Continued)

(52) U.S. Cl.
CPC ......... *H05K 7/20754* (2013.01); *G05B 15/02* (2013.01); *G06F 1/206* (2013.01);
(Continued)

(58) Field of Classification Search
CPC .... H05K 7/1497; H05K 7/20; H05K 7/20281; H05K 7/207; H05K 7/20745;
(Continued)

(56) References Cited

U.S. PATENT DOCUMENTS 8,070,569 B2 * 12/2011 Palmer ............ F24F 7/06
454/184
8,767,399 B2 * 7/2014 Goto ................ H05K 7/20209
361/679.51
(Continued)

FOREIGN PATENT DOCUMENTS

CN 102686952 9/2012
EP 2921931 A1 * 9/2015 ............. G06F 1/206
(Continued)

OTHER PUBLICATIONS

International Search Report, mailed in connection with PCT/JP2012/079792 and dated Dec. 25, 2012.
(Continued)

*Primary Examiner* — Crystal J Barnes-Bullock
(74) *Attorney, Agent, or Firm* — Fujitsu Patent Center

(57) ABSTRACT

A modular data center includes a fan which creates a cooling wind by taking in outside air, electronic devices which takes in the cooling wind and to discharge an exhaust flow, a flow passage which guides a part of the exhaust flow to upstream of the fan, an opening-closing portion which opens and closes the flow passage, and a control unit which adjusts the cooling wind by controlling the fan, and thereby to cool a temperature of the electronic device to a specified temperature. The control unit closes the opening-closing portion when a first assumed value of power consumed by the fan is smaller than a current value of the power. The control unit opens the opening-closing portion when a second assumed value of the power consumed by the fan is smaller than the current value of the power.

16 Claims, 11 Drawing Sheets

(51) Int. Cl.
*G06F 1/20* (2006.01)
*G05B 15/02* (2006.01)

(52) U.S. Cl.
CPC .......... *H05K 7/1497* (2013.01); *H05K 7/207* (2013.01); *H05K 7/20736* (2013.01); *H05K 7/20745* (2013.01); *H05K 7/20836* (2013.01); *Y02B 60/1275* (2013.01)

(58) Field of Classification Search
CPC .......... H05K 7/20754; H05K 7/20781; H05K 7/2079; H05K 7/20827; H05K 7/20836; G06F 1/20; G06F 1/206; F24F 7/06; F24F 11/0001; Y02B 60/1275; G05B 15/02
See application file for complete search history.

(56) References Cited

U.S. PATENT DOCUMENTS

| | | | | |
|---|---|---|---|---|
| 9,043,035 | B2 * | 5/2015 | Chainer | ............... G05D 7/0635 361/696 |
| 9,052,722 | B2 * | 6/2015 | Chainer | ............... G05D 7/0635 |
| 9,445,523 | B2 * | 9/2016 | Holzmann | ............... H05K 7/20 |
| 2006/0202045 | A1 * | 9/2006 | Liu | ............... H05K 7/20209 236/49.3 |
| 2011/0009047 | A1 | 1/2011 | Noteboom et al. | |
| 2011/0207392 | A1 * | 8/2011 | Ebermann | ............... H05K 7/20754 454/184 |
| 2011/0263192 | A1 * | 10/2011 | Kouninski | ............... F24F 1/0007 454/239 |
| 2011/0306288 | A1 | 12/2011 | Murayama et al. | |
| 2012/0164930 | A1 | 6/2012 | Murayama et al. | |
| 2017/0280594 | A1 * | 9/2017 | Sato | ............... H05K 7/20836 |
| 2017/0325362 | A1 * | 11/2017 | Slessman | ............... H05K 7/20836 |

FOREIGN PATENT DOCUMENTS

| | | | | |
|---|---|---|---|---|
| JP | 02-290454 | | 11/1990 | |
| JP | 08-193727 | | 7/1996 | |
| JP | 2006301763 A | * | 11/2006 | ............. G06F 1/206 |
| JP | 2010-261696 | | 11/2010 | |
| JP | 2012-098799 | | 5/2012 | |
| JP | 2012-222043 | | 11/2012 | |
| JP | 04294597 A | * | 4/2013 | ............. B01D 53/26 |
| JP | 2014112382 A | * | 6/2014 | ............. F28F 9/0265 |
| JP | 5979244 B2 | * | 8/2016 | ............. G06F 1/20 |
| JP | JPWO2014076814 A1 | * | 1/2017 | ............. B67D 3/00 |
| WO | 20110160933 A1 | | 12/2011 | |
| WO | WO-2014076814 A1 | * | 5/2014 | ............. G06F 1/206 |

OTHER PUBLICATIONS

EPOA—Office Action of corresponding European Patent Application No. 12888537.3 dated Mar. 15, 2017. All references cited in the Epoa were previously submitted in the Ids filed on Feb. 9, 2016.
CNOA—Office Action of Chinese Patent Application No. 201280077054.7 dated Jul. 31, 2017, with full English translation of the Office Action.
EESR—Extended European Search Report of European Patent Application No. 12888537.3 dated Nov. 18, 2015.

* cited by examiner

| temperature T(°C) | representative value φ of the operating rates (%) | | | | |
|---|---|---|---|---|---|
| | 100 | 80 | 60 | 40 | 20 |
| 18 | 0.723 | 0.370 | 0.156 | 0.046 | 0.006 |
| 18.5 | 0.728 | 0.373 | 0.157 | 0.047 | 0.006 |
| 19 | 0.735 | 0.376 | 0.159 | 0.047 | 0.006 |
| 19.5 | 0.743 | 0.380 | 0.160 | 0.048 | 0.006 |
| 20 | 0.752 | 0.385 | 0.162 | 0.048 | 0.006 |
| 20.5 | 0.762 | 0.390 | 0.165 | 0.049 | 0.006 |
| 21 | 0.774 | 0.397 | 0.167 | 0.050 | 0.006 |
| 21.5 | 0.788 | 0.404 | 0.170 | 0.050 | 0.006 |
| 22 | 0.804 | 0.412 | 0.174 | 0.051 | 0.006 |
| 22.5 | 0.822 | 0.421 | 0.178 | 0.053 | 0.007 | first assumed value P1 of the power consumed by the fan unit (kW)

32 {

| temperature T(°C) | representative value φ of the operating rates (%) | | | | |
|---|---|---|---|---|---|
| | 100 | 80 | 60 | 40 | 20 |
| 18 | 0.665 | 0.340 | 0.144 | 0.043 | 0.005 |
| 18.5 | 0.673 | 0.350 | 0.147 | 0.044 | 0.005 |
| 19 | 0.703 | 0.360 | 0.152 | 0.045 | 0.006 |
| 19.5 | 0.725 | 0.371 | 0.157 | 0.046 | 0.006 |
| 20 | 0.749 | 0.383 | 0.162 | 0.048 | 0.006 |
| 20.5 | 0.775 | 0.397 | 0.167 | 0.050 | 0.006 |
| 21 | 0.803 | 0.411 | 0.173 | 0.051 | 0.006 |
| 21.5 | 0.833 | 0.426 | 0.180 | 0.053 | 0.007 |
| 22 | 0.864 | 0.443 | 0.187 | 0.055 | 0.007 |
| 22.5 | 0.898 | 0.460 | 0.194 | 0.057 | 0.007 | second assumed value P2 of the power consumed by the fan unit (kW)

MODULAR DATA CENTER AND METHOD OF CONTROLLING MODULAR DATA CENTER

CROSS-REFERENCE TO RELATED APPLICATION

This application is a continuation of International Patent Application No. PCT/JP2012/79792 filed on Nov. 16, 2012 and designated the U.S., the entire contents of which are incorporated herein by reference.

FIELD

The embodiments discussed herein are related to a modular data center and a controlling method of a modular data center.

BACKGROUND

Electronic devices such as servers are installed in a data center. As a method of cooling the electronic devices, there is a method using outside air. According to this method, the outside air is taken into the data center by rotating fans, and the electronic devices are cooled directly with the outside air, without the outside air being cooled by using a heat exchanger and the like. Thus, this method does not require electric power for the heat exchanger and the like, and is therefore able to contribute to energy saving in the whole of the data center.

However, when the outside air is directly used in the case where the outside air temperature is low as in winter, the electronic devices may be cooled excessively and the temperatures of the electronic devices may deviate from their operation guarantee ranges. For this reason, it is desirable to warm the inside of the data center by using some mechanisms. However, in some operating conditions of the mechanisms, there is a risk of an increase in power consumption in the data center.

Note that techniques relating to the present application are disclosed in Japanese Laid-open Patent Publication No. 02-290454 and Japanese Laid-open Patent Publication No. 08-193727.

SUMMARY

According to an aspect discussed herein, there is provided a modular data center including an enclosure including an intake port and an exhaust port, a fan provided in the enclosure and configured to create a cooling wind by taking in outside air from the intake port, a plurality of electronic devices provided in the enclosure and configured to take in the cooling wind and to discharge an exhaust flow created from the taken cooling wind to the exhaust port, a flow passage guiding a part of the exhaust flow to upstream of the fan, an opening-closing portion configured to open and close the flow passage, and a control unit configured to adjust an air volume of the cooling wind by controlling the fan, and thereby to cool a temperature of each electronic device to a specified temperature, wherein the control unit executes closing the opening-closing portion when a first assumed value of power consumed by the fan assumed to be consumed in a case of bringing the temperature of the electronic device to the specified temperature by using the cooling wind while closing the opening-closing portion is smaller than a current value of the power, and opening the opening-closing portion when a second assumed value of the power consumed by the fan assumed to be consumed in a case of bringing the temperature of the electronic device to the specified temperature by using the cooling wind while opening the opening-closing portion is smaller than the current value of the power.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 9 schematically illustrates the contents of the processing in step S5;

DESCRIPTION OF EMBODIMENTS

Prior to explaining the present embodiments, results of studies conducted by the inventors of the present application will be explained.

While there are various types of data centers, a data center constructed by housing a fan unit and racks in a container is called a modular data center. Such a modular center has high cooling efficiency and therefore has an advantage in energy saving because only the space in the container needs to be cooled.

Figure 1:
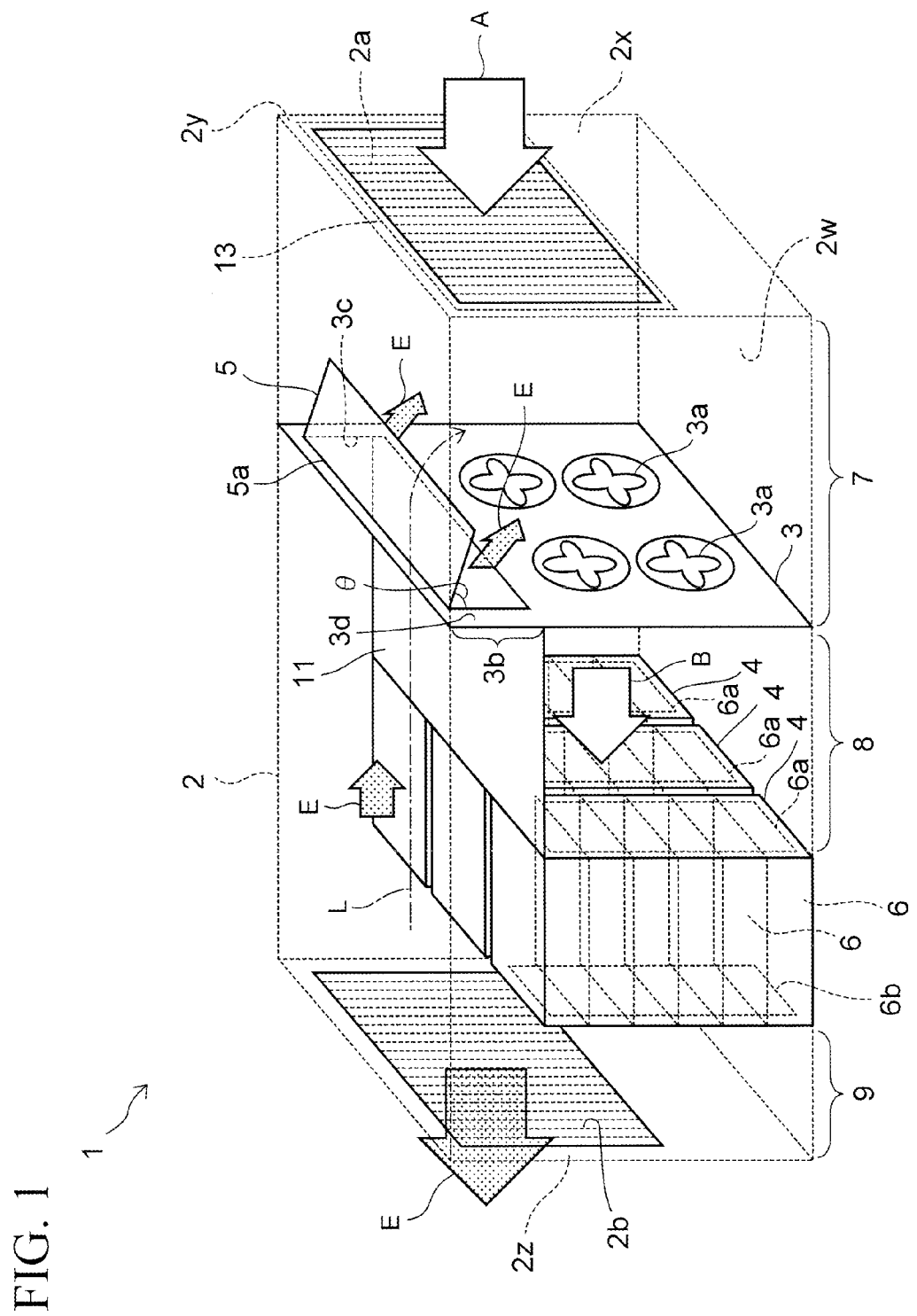
FIG. 1 is a perspective view illustrating an internal configuration of a modular data center.

FIG. 1 is a perspective view illustrating an internal configuration of a modular data center used for the studies by the inventors of the present application.

This modular data center 1 includes a metallic container 2, which is an example of an enclosure. A fan unit 3 and a plurality of racks 4 opposed thereto provided in the container 2.

The container 2 has a rectangular parallelepiped shape provided with first to fourth side faces $2w$, $2x$, $2y$, and $2z$. Among these side faces, the first side face $2w$ and the second side face $2x$ have rectangular shapes which are opposed to each other. Meanwhile, an intake port $2a$ for taking in outside air A is provided to the third side face 2y, while an exhaust port 2b is provided to the fourth side face 2z.

Here, the shape of the intake port 2a is not limited to a particular shape. The intake port 2a may be formed from an aggregate of holes. Alternatively, a single opening may be formed as the intake port 2a. This is also the case for the intake ports 2b.

Meanwhile, it is preferable to provide the intake port 2a with a ventilation cover 13 such as a filter or a louver in order to avoid entry of rainwater and insects into the container 2.

The fan unit 3 is always in an operating state as long as the data center 1 is in operation. The fan unit 3 includes a plurality of fans 3a which create a cooling wind B from outside air A taken in from the intake port 2a.

In order to suppress power consumption of the fan unit 3, the fan unit 3 is not provided with a cooling mechanism such as a heat exchanger for cooling the outside air A. Accordingly, the cooling wind B is created directly from the outside air A without changing the temperature of the outside air A.

Meanwhile, a space between the intake port 2a and the fan unit 3 in the container 2 is served as a first room 7, into which the above-mentioned outside air A is to be taken.

On the other hand, the plurality of racks 4 is arranged in a width direction of the container 2. Moreover, the racks 4 hold the electronic devices 6 such as servers, which are air cooled by the cooling wind B. Each electronic device 6 has an intake face 6a for taking in the cooling wind B. Each electronic device 6 is cooled by the cooling wind B which is taken in from the intake face 6a.

Here, a space between the fan unit 3 and the intake face 6a in the container 2 is served as a cold aisle 8 in which the cooling wind B flows. The cold aisle 8 is an example of a second room.

After the cooling wind B is taken into each electronic device 6, the cooling wind B is warmed by heat-generating components such as a CPU (central processing unit) and a GPU (graphical processing unit) included in each electronic device 6, and is then discharged as an exhaust flow E from an exhaust face 6b.

A space between the exhaust face 6b and the exhaust port 2b in the container 2 is served as a hot aisle 9 in which the warm exhaust flow E flows. The hot aisle 9 is an example of a third room, which shares the first side face 2w and the second side face 2x with the first room 7 and the cold aisle 8.

Here, a part of the exhaust flow E flowing in the hot aisle 9 bounces off the fourth side face 2z and circulates in the container 2. In this example, a height of each of the racks 4 is set lower than the container 2. A flow passage L, through which the exhaust flow E flows, is provided above the racks 4.

The flow passage L is connected to the first room 7 and the hot aisle 9, respectively, and guides the exhaust flow E in the hot aisle 9 to upstream of the fan unit 3. Here, the upstream and downstream of the fan unit 3 is defined based on the flowing direction of the cooling wind B, and the upstream corresponds to the first room 7, while the downstream corresponds to the cold aisle 8.

Meanwhile, a ceiling of the cold aisle 8 is defined by a plate-shaped partitioning member 11. The partitioning member 11 isolates the flow passage L from the cold aisle 8. Accordingly, the exhaust flow E flowing in the flow passage L does not flow into the cold aisle 8.

Moreover, an extended portion 3b formed by extending the fan unit 3 vertically upward is provided midway in the flow passage L. Outer peripheral edges of the extended portion 3b are in contact with inner surfaces of the container 2. Accordingly, the exhaust flow E does not flow into the first room 7 from the outer peripheral edges of the extended portion 3b.

In addition, an opening 3c is formed in the extended portion 3b, and a damper serving as an opening-closing portion 5 to open and close the opening 3c is provided.

The opening-closing portion 5 has a function to open and close the flow passage L, and has a rectangular planar shape which occludes the opening 3c. Meanwhile, the opening-closing portion 5 is provided with a shaft 5a located on a principal surface 3d of the extended portion 3b, and is rotatable about the shaft 5a by rotating an unillustrated motor. In this example, a degree $\theta$ of an aperture of the opening-closing portion 5 measured from the principal surface 3d is made adjustable either continuously or stepwise in a range from 0° to 90°. Thus, it is possible to adjust a flow rate of the exhaust flow E which flows through the flow passage L.

Here, the angle between the principal surface 3d and the opening-closing portion 5 is defined as the degree $\theta$ of the aperture in this example. Alternatively, an opening rate of the opening 3c may be employed as the degree $\theta$ of the aperture.

When the exhaust flow E is guided to the upstream side of the fan unit 3 via the opening-closing portion 5, the warm exhaust flow E and the outside air A are mixed together in the first room 7. Accordingly, it is possible to increase the temperature of the cooling wind B to be supplied to the cold aisle 8.

By warming the cooling wind B with the exhaust flow E in this manner, the data center 1 can prevent the electronic devices 6 from excessive cooling when the temperature of the outside air A is low like in winter.

Figure 2:
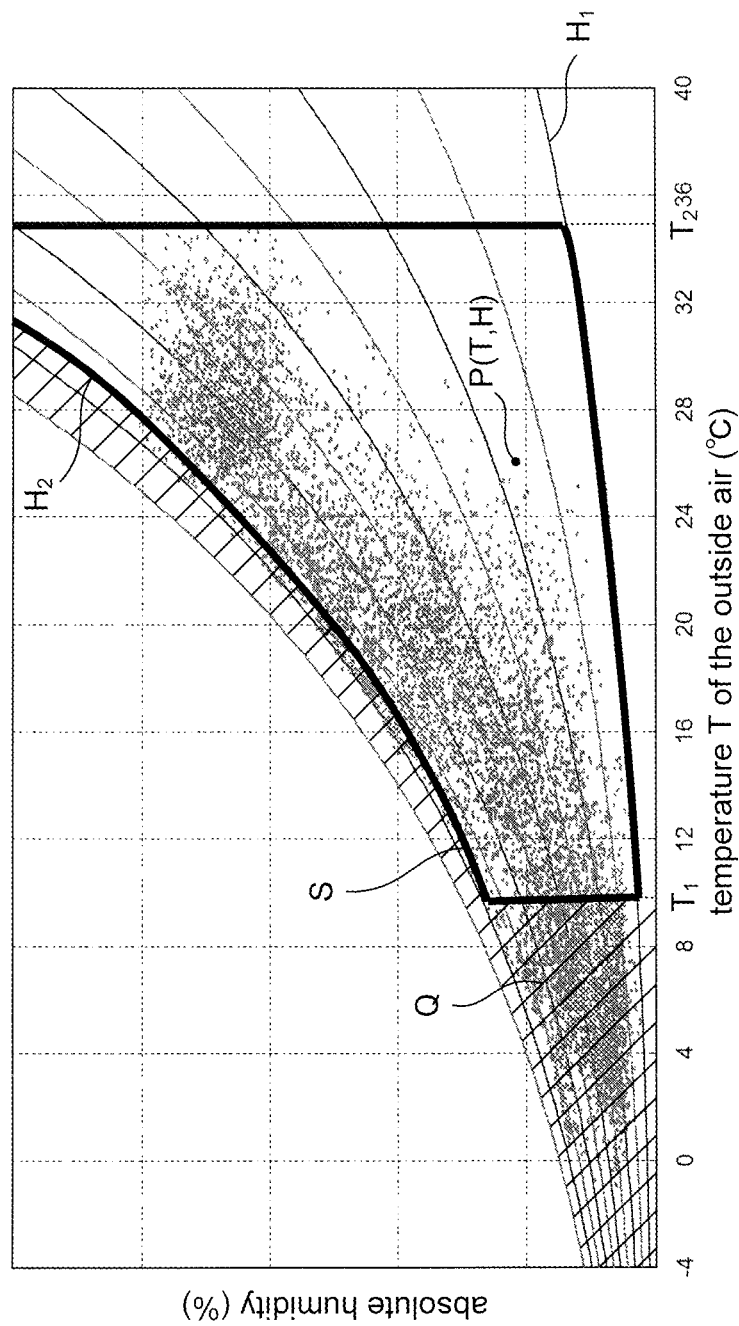
FIG. 2 is a psychrometric chart for explaining an operation guarantee range of an electronic device.

FIG. 2 is a psychrometric chart for explaining an operation guarantee range of each electronic device. The psychrometric chart plots iso-relative humidity lines. The horizontal axis of the chart indicates a dry-bulb temperature, and the vertical axis thereof indicates an absolute humidity.

In the following, a temperature T of the outside air A is measured as the dry-bulb temperature, while a humidity H of the outside air A is measured as a relative humidity. A plurality of dots in FIG. 2 represents actual measured values of the dry-bulb temperatures and the relative humidities of the outside air in Tokyo.

A temperature range $T_1$ to $T_2$ of the dry-bulb temperature and a humidity range $H_1$ to $H_2$ of the relative humidity are set to each electronic device 6 in order to guarantee their operation. In FIG. 2, a region in the temperature range and the humidity range is indicated as an operation guarantee region S.

In the following, the temperature range $T_1$ to $T_2$ is set to a range from 10° C. to 35° C., and the humidity range $H_1$ to $H_2$ is set to a range from 10% to 85%, for example. A lower limit temperature $T_1$ and an upper limit temperature $T_2$ of the temperature range $T_1$ to $T_2$ are limit temperatures which allow normal operation of an unillustrated operating unit such as a CPU and a GPU in the electronic device 6. Meanwhile, a lower limit humidity $H_1$ in the humidity range $H_1$ to $H_2$ is an approximate humidity at which the electronic device 6 is likely to be damaged by static electricity due to dry air, while an upper limit humidity $H_2$ is a humidity at which dew condensation due to highly humid air is likely to occur in the electronic device 6.

When a state point P, whose coordinates are the temperature T and the humidity H of the outside air A, is located within the operation guarantee range S, it is possible to air cool the electronic devices 6 by directly using the outside air A. Accordingly, in this case, the electronic devices 6 may be cooled by using only the cooling wind B while closing the opening-closing portion 5.

On the other hand, when the temperature T of the outside air A is lower than the lower limit temperature $T_1$ of the operation guarantee range S as in winter, the cooling wind B is warmed with the exhaust flow E by opening the opening-closing portion 5. Thus, a state point of a mixed air flow of the cooling wind B and the exhaust flow E is set within the operation guarantee range S, and the electronic devices 6 can be prevented from excessive cooling.

Moreover, when the humidity H of the outside air A is higher than the upper limit humidity $H_2$, a relative humidity of the mixed air flow of the exhaust flow E and the cooling wind B is reduced by opening the opening-closing portion 5 and thereby warming the cooling wind B with the exhaust flow E. Thus, the state point of the mixed air flow can be set within the operation guarantee range S.

In FIG. 2, a region to open the opening-closing portion 5 as described above is hatched, and this region is indicated as an operation region Q of the opening-closing portion 5. Moreover, the lower limit temperature $T_1$ located on a boundary between the operation region Q and the operation guarantee region S constitutes one of threshold temperatures to open the opening-closing portion 5.

Hence, the opening-closing portion 5 is opened and the cooling wind B is warmed with the exhaust flow E when the temperature T of the outside air A is lower than the lower limit temperature $T_1$. However, actual temperatures of the electronic devices 6 also depend on an air volume of the cooling wind B. For example, even if the temperature T of the outside air A is constant, the electronic device 6 is cooled down more efficiently when the air volume of the cooling wind B is larger. Then, when the air volume of the cooling wind B is small, the electronic device 6 is prone to be cooled insufficiency.

Furthermore, amount of heat generation by the electronic device 6 may be increased when operating rate of the electronic device 6 is high. In this case, the electronic device 6 may not be sufficiently cooled unless the air volume of the cooling wind B is increased.

Accordingly, the mere opening and closing operations of the opening-closing portion 5 as described above are not enough for controlling the temperature of the electronic device 6. The electronic device 6 needs to be cooled to a predetermined temperature by controlling the number of rotation of the fan 3a, and thereby adjusting the air volume of the cooling wind B.

There are no limitations as to how much the electronic devices 6 are to be cooled. In the following, a temperature at which each electronic device 6 causes thermal runaway is preset as a specified temperature $T_s$, and the number of rotation of the fan 3a is controlled such that the temperature of the electronic device 6 does not exceed the specified temperature $T_s$, thereby adjusting the air volume of the cooling wind B.

However, even when the number of the revolution of the fan 3a is the same, the air volume of the cooling wing B varies in accordance with a static pressure of the fan 3a. The static pressure is defined as a difference in pressure between the upstream side and the downstream side of the fan 3a.

In the example of FIG. 1, the pressure in the first room 7 from which the outside air A is taken out by the fan 3a is thought to be smaller than the pressure in the cold aisle 8 to which the cooling wind B is supplied by the fan 3a. Accordingly, when the static pressure of the fan 3a becomes high, the air volume of the cooling wind B that the fan 3a can send out is reduced as compared to that in the case where the static pressure is small. Hence, the fan 3a may not be able to create the required amount of the cooling wind B for cooling the electronic device 6 to the specified temperature T.

Particularly, when the intake port 2a is provided with the ventilation cover 13 such as the filter or the louver, the intake of the outside air A at the intake port 2a is deteriorated, and the pressure in the first room 7 is further reduced. Hence, the reduction in air volume of the cooling wind B becomes significant.

On the other hand, when the exhaust flow E is supplied to the first room 7 by opening the opening-closing portion 5, the pressure in the first room 7 is increased more than that in the case where the opening-closing portion 5 is closed. Hence, the static pressure of the fan 3a is reduced and the air volume of the cooling wind B is increased.

Accordingly, by opening the opening-closing portion 5, it is thought to be possible to create the required amount of the cooling wind B for cooling the electronic device 6 to the specified temperature $T_s$ even by reducing the number of rotation of the fan 3a, and thereby to reduce the power consumption by the fan unit 3.

However, since the cooling wind B is warmed by the exhaust flow E when the opening-closing portion 5 is opened, it is also conceivable that the required amount of the cooling wind B for cooling the electronic device 6 to the specified temperature $T_s$ is increased more than that in the case of closing the opening-closing portion 5, and that the power consumption by the fan unit 3 is likely to be increased accordingly.

In this manner, it cannot instantly be determined whether or not the opening and closing operations of the opening-closing portion 5 are effective for the reduction in power consumption by the fan unit 3.

Therefore, the inventors of the present application investigated in which case the opening-closing portion 5 is to be opened or closed in order to reduce the power consumption by the fan unit 3.

Figure 3:
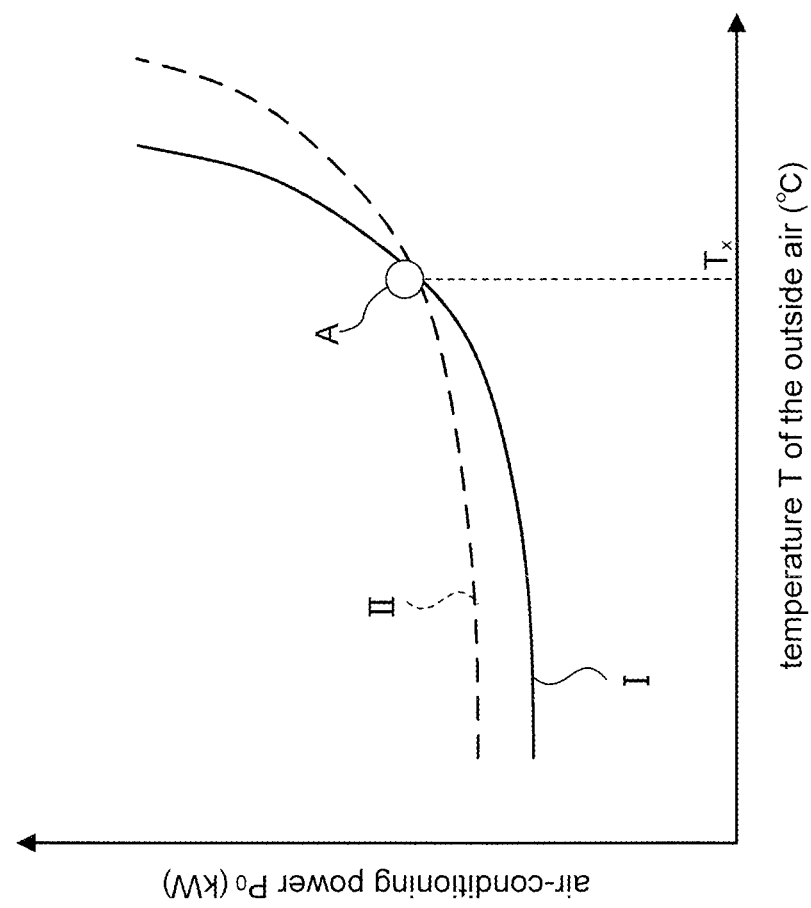
FIG. 3 is a graph illustrating a relation between a temperature of outside air and electric power consumed by a fan unit required to cool each electronic device to a specified temperature when an operating rate of the electronic device is fixed.

FIG. 3 illustrates a result of the investigation.

FIG. 3 is a graph illustrating a relation between the power $P_0$ consumed by the fan unit 3 required for cooling each electronic device 6 to the specified temperature $T_s$ and the temperature T of the outside air A when the operating rate of each electronic device 6 is fixed.

A graph I in the case of opening the opening-closing portion 5 and a graph II in the case of closing the opening-closing portion 5 were acquired in this investigation.

As illustrated in FIG. 3, there exists an intersection point A where the graphs I and II intersect with each other. Here, when the temperature T is lower than a temperature $T_x$ of the intersection point A, the power $P_0$ becomes lower by opening the opening-closing portion 5.

Meanwhile, when the temperature T is higher than the temperature $T_x$, the power $P_0$ becomes lower by closing the opening-closing portion 5.

This result made it clear that it is preferable to determine whether to open or close the opening-closing portion 5 on the basis of the temperature $T_x$ of the intersection point A in order to reduce the power $P_0$ consumed by the fan unit 3. The temperature $T_x$ of the intersection point A does not always coincide with the lower limit temperature $T_1$ illustrated in FIG. 2. Accordingly, when the opening and closing operations of the opening-closing portion 5 are determined on the basis of the lower limit temperature $T_1$, some of the power $P_0$ may be consumed uselessly, which is disadvantageous for the energy saving in the data center 1.

In the followings, embodiments will be described.

Embodiment

In this embodiment, the modular data center 1 of FIG. 1 is controlled as described below, so that the power consumption of the data center 1 is reduced.

Figure 4:
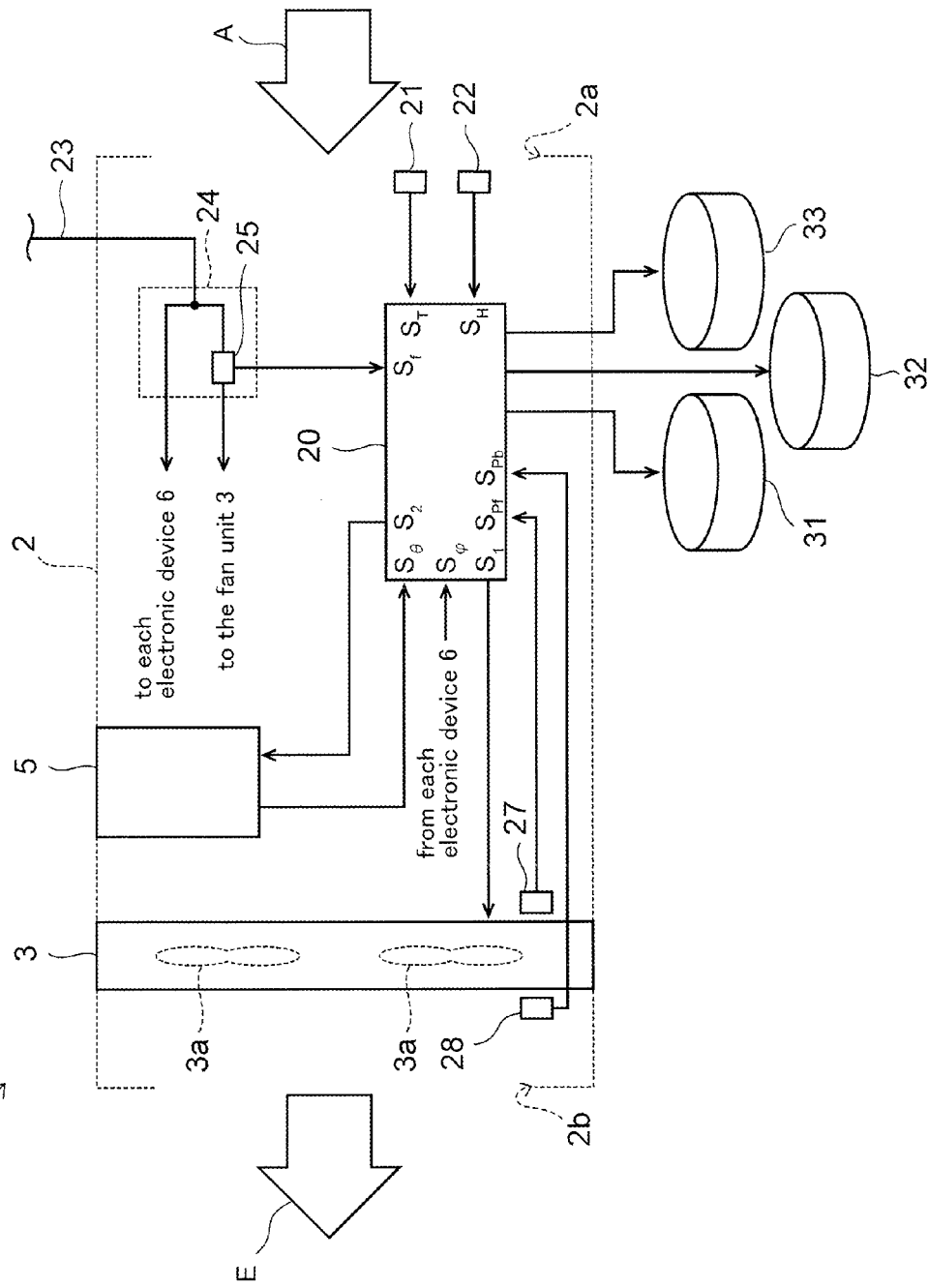
FIG. 4 is a functional block diagram of a modular data center according to an embodiment.

FIG. 4 is a functional block diagram of the modular data center 1. Note that this functional block diagram schematically illustrates functional links between the functional blocks in the modular data center 1. Accordingly, there are some portions which are different from an actual layout of constituents that correspond to each function.

As illustrated in FIG. 4, in this embodiment, the modular data center 1 is provided with a control unit 20, a temperature sensor 21, a humidity sensor 22, a power line 23, a switchboard 24, a first pressure sensor 27, and a second pressure sensor 28.

Among them, a dedicated computer may be used as the control unit 20, or one of the pluralities of electronic devices 6 (see FIG. 1) may be used as the control unit 20.

The control unit 20 outputs a first control signal $S_1$ to the fan unit 3. Thus, the control unit 20 adjusts the numbers of rotations of the fans 3a and controls the air volume of the cooling wind B, thereby cooling the electronic devices 6 to the specified temperature $T_s$. Here, a method of adjusting the number of rotation of the fan 3a is not particularly limited. However, it is preferable to cause the control unit 20 to monitor actual temperatures of the electronic devices 6 and to control the number of rotation of the fan 3a in real time in accordance with the actual temperatures.

Moreover, the control unit 20 outputs a second control signal $S_2$ to the damper provided as the opening-closing portion 5, thereby controlling the degree θ of the aperture of the opening-closing portion 5. Then, aperture information Sθ indicating the actual degree θ of the aperture of the opening-closing portion 5 is outputted from the opening-closing portion 5 to the control unit 20.

The power line 23 is used to supply electric power from outside into the data center 1. The power line 23 branches off to two lines at the switchboard 24 in the data center 1. One of the branched lines is connected to the fan unit 3, and the power consumption of all the fans 3a in the fan unit 3 is monitored by a power meter 25. The power meter 25 outputs the power currently consumed by the fan unit 3 as power information $S_f$ to the control unit 20. The other line branched off from the power line 23 is connected to the plurality of electronic devices 6.

In the meantime, the temperature sensor 21 and the humidity sensor 22 are provided at positions in the vicinity of the intake port 2a and the like and exposed to the outside air A. The temperature sensor 21 and the humidity sensor 22 measure the temperature T and the humidity H of the outside air A, and output the measured values to the control unit 20 as temperature information $S_T$ and humidity information $S_H$, respectively.

Moreover, the first pressure sensor 27 measures an atmospheric pressure $P_f$ at the upstream side of the fan 3a and outputs the measured value to the control unit 20 as first pressure information $S_{Pf}$. Meanwhile, the second pressure sensor 28 measures an atmospheric pressure $P_b$ at the downstream side of the fan 3a and outputs the measured value to the control unit 20 as second pressure information $S_{Pb}$.

Furthermore, operating rate information Sφ is inputted from each of the plurality of electronic devices 6 to the control unit 20. The operating rate information Sφ is information indicating an operating rate $\varphi_0$ of each electronic device 6, which is outputted from each electronic device 6. Although the operating rate $\varphi_0$ is not particularly limited, the operating rate of the processing unit such as the CPU and the GPU included in the electronic device 6 may be employed as the operating rate $\varphi_0$.

Based on the temperature information $S_T$, the humidity information $S_H$, the operating rate information Sφ, and the aperture information Sθ described above, the control unit 20 can acquire parameters T, H, $\varphi_0$, and θ in real time, which respectively correspond to the above information.

Then, based on these parameters, the control unit 20 refers to at least one of first to third databases 31 to 33, and determines whether the opening-closing portion 5 is to be opened or closed in order to reduce the power consumed by the fan unit 3.

Here, the first to third databases 31 to 33 may be provided outside the modular data center 1 or may be held by the control unit 20. Note that the contents of the databases 31 to 33 will be described later.

Next, a controlling method of the modular data center of this embodiment will be described with reference to FIG. 4, FIG. 5, and the like.

Figure 5:
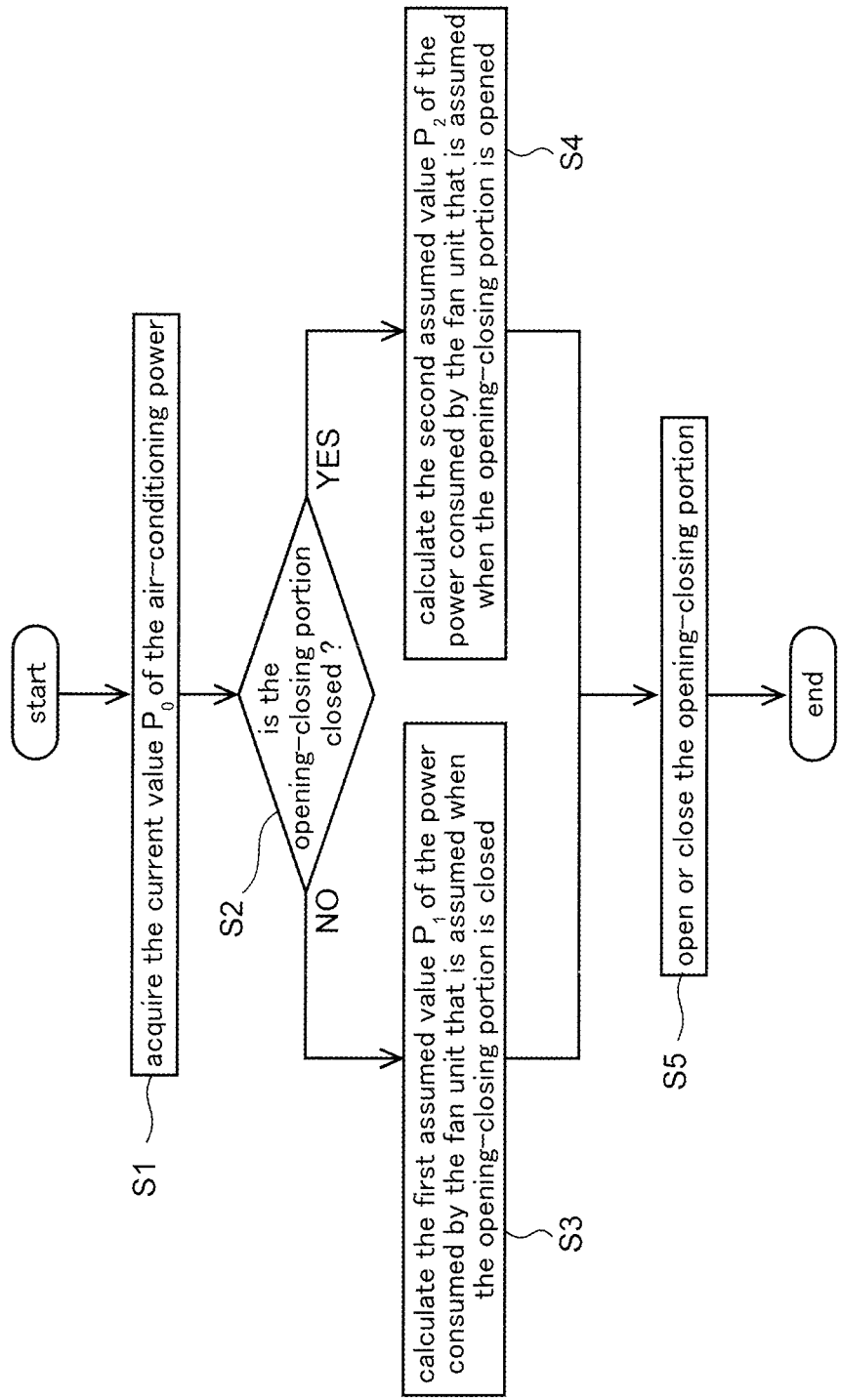
FIG. 5 is a flowchart illustrating a controlling method of a modular data center according to the embodiment.

FIG. 5 is a flowchart illustrating the controlling method of the modular data center of this embodiment.

In the first step S1, the control unit 20 refers to the above-described power information $S_f$ and thereby acquires the current value $P_0$ of the power consumed by the fan unit 3.

Next, the method proceeds to step S2, in which the control unit 20 determines whether or not the opening-closing portion 5 is closed. This step is executed by causing the control unit 20 to obtain the degree θ of the aperture of the opening-closing portion 5 on the basis of the aperture information Sθ, and to determine that the opening-closing portion 5 is closed when the degree θ is equal to 0°, and to determine that the opening-closing portion 5 is not closed when the degree θ is not equal to 0°.

Here, the method proceeds to step S3, when the opening-closing portion 5 is determined to be not closed (NO).

In step S3, a first assumed value $P_1$ of the power consumed by the fan unit 3, which is assumed in the case of bringing the temperature of the electronic device 6 to the aforementioned specified temperature $T_s$ by using the cooling wind B while closing the opening-closing portion 5, is calculated as described below.

When the temperature T of the outside air A is high or when the operating rate $\varphi_0$ of each electronic device 6 is large, the air volume of the cooling wind B required for cooling each electronic device 6 to the specified temperature $T_s$ also becomes large. As a consequence, the first assumed value $P_1$ is increased as well.

In this manner, the first assumed value $P_1$ of the power consumed by the fan unit 3 depends on the temperature T of the outside air A and the operating rate $\varphi_0$. Although the operating rates $\varphi_0$ vary among the electronic devices 6, one representative value φ representing the plurality of the operating rates $\varphi_0$ is used in this embodiment, and the first assumed value $P_1$ is expressed as $P_1 = f(T, \varphi)$ by using an appropriate function f. Here, an average value or a maximum value of the plurality of operating rates $\varphi_0$ may be used as the representative value φ.

The function f provides the first assumed value $P_1$ of the power consumed by the fan unit 3 which is required for bringing the temperature of each electronic device 6 to the specified temperature $T_s$ when the values T and φ are given. The function f is an example of the above-mentioned first database 31.

Figure 6:
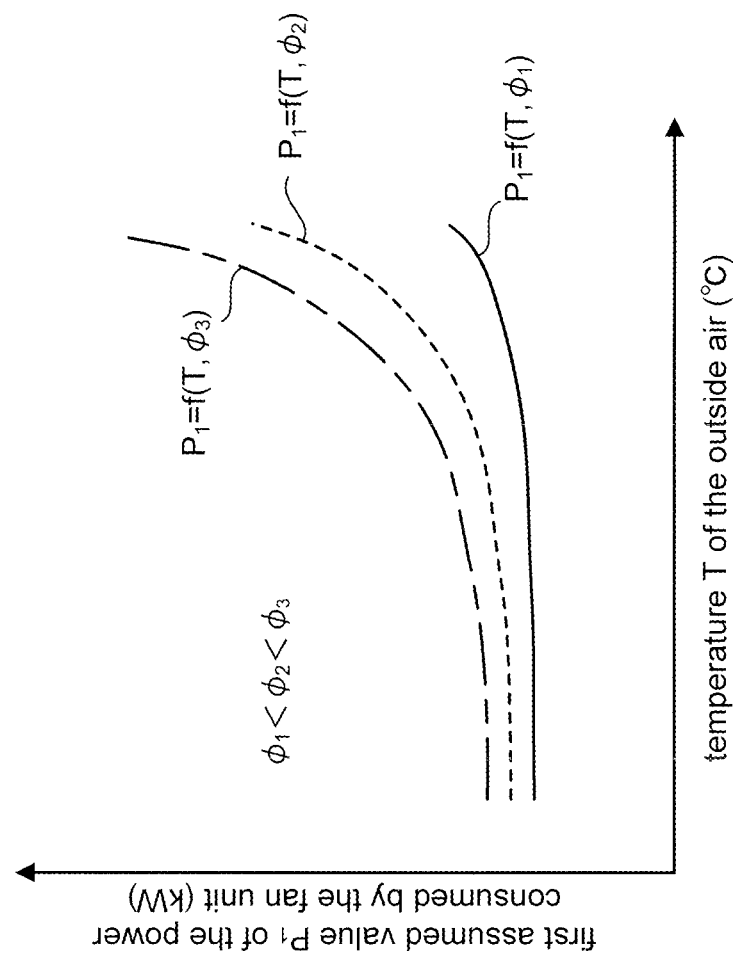
FIG. 6 is a graph schematically illustrating a first database used in the embodiment.

FIG. 6 is a graph schematically illustrating the first database 31.

Each curve in FIG. 6 represents the above-described function f in the form of a graph. The horizontal axis of the graph is the temperature T of the outside air A, while the vertical axis thereof is the first assumed value $P_1$ of the power consumed by the fan unit 3.

Note that FIG. 6 illustrates three graphs respectively corresponding to progressively-increasing representative values $φ_1$, $φ_2$, and $φ_3$. The graphs can be obtained by means of simulation, or by conducting experiments while actually operating the modular data center 1.

The control unit 20 can acquire the first assumed value $P_1$ corresponding to the current values of T and φ by referring to the first database 31.

Note that the first database 31 is not limited to the graphs illustrated in FIG. 6, and may be formed from a table storing the respective values T, φ, and $P_1$.

On the other hand, the method proceeds to step S4, when the opening-closing portion 5 is determined to be closed (YES) in step S2 of FIG. 5.

In this step, a second assumed value $P_2$ of the power consumed by the fan unit 3, which is assumed in the case of bringing the temperature of the electronic device 6 to the aforementioned specified temperature $T_s$ by using the cooling wind B while opening the opening-closing portion 5, is calculated as described below.

When the opening-closing portion 5 is opened, the power consumed by the fan unit 3 is thought to be increased as described above since the temperature of the cooling wind B is increased by being mixed with the exhaust flow E. On the other hand, the power is also thought to be decreased since the static pressure of the fan 3a is reduced.

Accordingly, when calculating the second assumed value $P_2$, it is preferable to obtain the second assumed value $P_2$ which is corrected in consideration of the changes in temperature and static pressure as described above. The second assumed value $P_2$ prior to the correction in consideration of the above-mentioned changes is denoted by $P'''_2$. Since the change in temperature or the change in static pressure is not considered, $P'''_2$ is expressed as $P'''_2=f(T, φ)$ as in the first assumed value $P_1$.

In order to correct $P'''_2$ by taking into account the change in temperature, the temperature of the cooling wind B is assumed to be rose by a value $T_H$ as compared to the state where the opening-closing portion 5 is closed. Let P' be the corrected $P'''_2$ that is corrected in consideration of this temperature rise, then the relation $P'_2=f(T+T_H, φ)$ holds. In the derivation of $P'_2$, only the change in temperature is taken into account, whereas the change in static pressure is not taken into account. Therefore, it is hypothecated that the form of the function $P'_2$ is the same as that of f, and its first variable is replaced by $T+T_H$.

In the meantime, the temperature rise $T_H$ is thought to be small when the degree θ of the aperture of the opening-closing portion 5 is small and thus a flow rate of the exhaust flow E flowing through the opening-closing portion 5 is small. Moreover, a temperature decrease $T_H$ is thought to be small depending on the temperature T of the outside air A. Furthermore, when the operating rates of the electronic devices 6 are high and their representative value φ is large, the temperature of the exhaust flow E is increased. Thus, the temperature rise $T_H$ of the cooling wing B is thought to be increased.

In this manner, the temperature rise $T_H$ depends on the parameters θ, T, and φ. Accordingly, the temperature rise $T_H$ is expressed as $T_H=h(T, θ, φ)$ by using an appropriate function h in this embodiment. The form of the function h can be obtained by means of simulation, or by conducting experiments while actually operating the modular data center 1.

By using the function h, the above-described $P'_2$ can be expressed as $P'_2=f(T+h(T, θ, φ), φ)$.

The second assumed value $P_2$ to be calculated in this step can be calculated by further correcting $P'_2$ in consideration of the change in static pressure of the fan 3a. The second assumed value $P_2$ is thought to depend on the value $P'_2$ before the correction and on the degree θ of the aperture of the opening-closing portion 5. Accordingly, the second assumed value $P_2$ can be expressed as $P_2=i(P'_2, θ)$ by using an appropriate function i.

The function i may be determined by use of a static pressure—air volume characteristic of the fan 3a, or obtained by conducting experiments while actually operating the data center 1.

Figure 7:
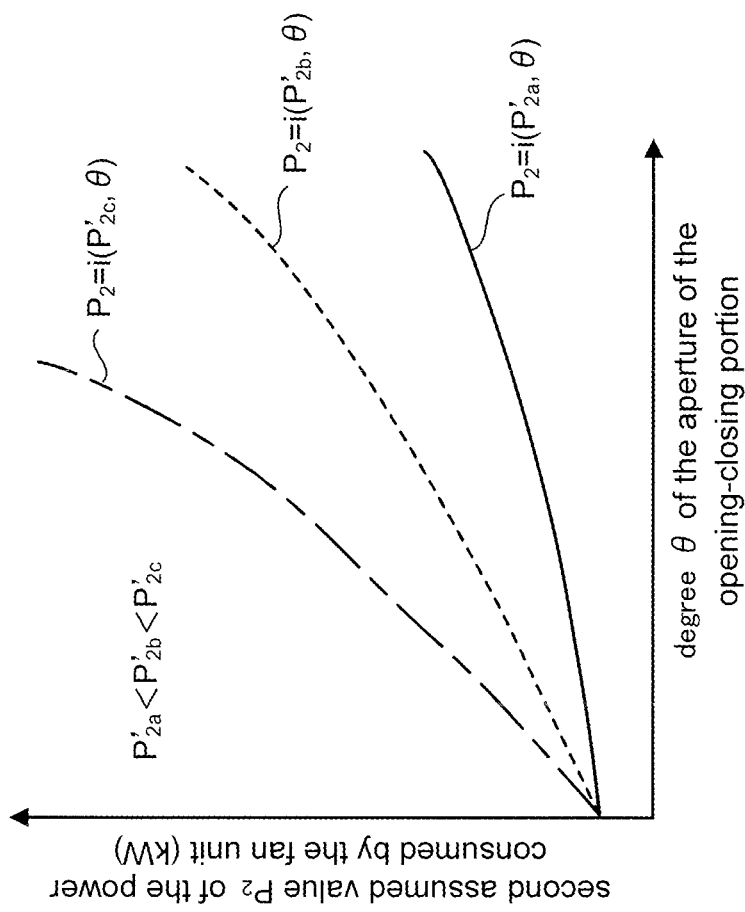
FIG. 7 is a graph schematically illustrating a function i used in the embodiment.

FIG. 7 is a graph schematically illustrating the above-described function i.

Each curve in FIG. 7 represents the function i in the form of a graph. The horizontal axis of the graph is the degree θ of the aperture of the opening-closing portion 5, while the vertical axis thereof is the second assumed value $P_2$ of the power consumed by the fan unit 3.

Note that FIG. 7 illustrates three graphs respectively corresponding to progressively-increasing values $P'_{2a}$, $P'_{2b}$, and $P'_{2c}$, which are not subjected to the correction.

By using this function i, the second assumed value $P_2$ of the power consumed by the fan unit 3 is expressed as $P_2=i(P'_2, θ)=i(f(T+h(T, θ, φ), φ), θ)$. By using this equation, the second assumed values $P_2$ corresponding to the parameters T, θ, and φ are stored in the second database 32 in advance.

Then, step S4 can be executed by causing the control unit 20 to refer to the second database 32 and to read the second assumed value $P_2$ corresponding to the current parameters T, θ, and φ.

In this embodiment, the second assumed value $P_2$ is corrected in consideration of the change in temperature of the cooling wind B and the change in static pressure of the fan 3a associated with the opening of the opening-closing portion 5 as described above. Accordingly, it is possible to accurately obtain the second assumed value $P_2$ to be expected in the future.

Note that this step is not limited to the above. Instead, the second assumed value $P_2$ may be calculated by causing the control unit 20 to refer to the third database 33 (see FIG. 4).

In the case of using the third database 33, the second assumed value $P_2$ is expressed as $P_2=j(P'_2, ΔP)$ by using an appropriate function j instead of the above-described function i.

The function j is a function which derives the second assumed value $P_2$ from the value $P'_2$ before the correction and a static pressure ΔP of the fan 3a. The reason for using the value $P'_2$ as the first variable of the function j is that the second assumed value $P_2$ is thought to depend on the value $P'_2$ before the correction as in the function i. Meanwhile, the reason for using the static pressure ΔP as the second variable of the function j is that it is more difficult for the fan 3a to send out the cooling wind B as the static pressure ΔP becomes higher, and the required air volume of the cooling wind B for bringing each electronic device 6 to the specified temperature $T_s$ cannot be created unless the number of rotation of the fan 3a is increased.

Figure 8:
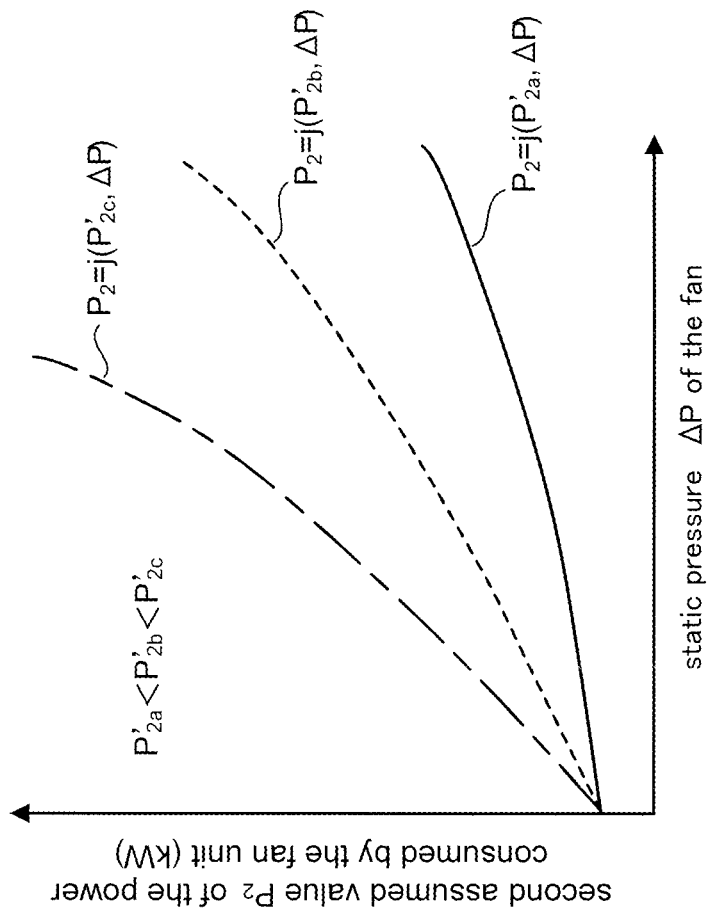
FIG. 8 is a graph schematically illustrating a function j used in the embodiment.

FIG. 8 is a graph schematically illustrating the above-described function j.

Each curve in FIG. 8 represents the function j in the form of a graph. The horizontal axis of the graph is the static pressure $\Delta P$ of the fan 3a, while the vertical axis thereof is the second assumed value $P_2$ of the power consumed by the fan unit 3.

Note that FIG. 8 illustrates three graphs respectively corresponding to the progressively-increasing values $P'_{2a}$, $P'_{2b}$, and $P'_{2c}$ prior to the correction as in FIG. 7.

By using the function j, the second assumed value $P_2$ of the power consumed by the fan unit 3 is expressed as $P_2=j(P'_2, \Delta P)=j(f(T+h(T, \theta, \varphi), \varphi), \Delta P)$. By using this equation, the second assumed values $P_2$ corresponding to the parameters T, $\theta$, $\varphi$, and $\Delta P$ are stored in the third database 33 in advance.

Then, step S4 can be executed by causing the control unit 20 to refer to the third database 33 and to read the second assumed value $P_2$ corresponding to the current parameters T, $\theta$, $\varphi$, and $\Delta P$. Note that the static pressure $\Delta P$ is calculated by the control unit 20 by finding a difference $(P_b-P_f)$ between the pressures $P_f$ and $P_b$ respectively included in the first pressure information $S_{Pf}$ and the second pressure information $S_{Pb}$.

After step S3 or step S4 is completed in this manner, the method proceeds to step S5 of FIG. 5.

In step S5, the control unit 20 evaluates a magnitude relation between the current value $P_0$ and the first assumed value $P_1$ of the power consumed by the fan unit 3, and a magnitude relation between the current value $P_0$ and the second assumed value $P_2$ of the power.

Here, the first assumed value $P_1$ is the assumed value of the power consumed by the fan unit 3, which is assumed in the case of closing the opening-closing portion 5. Accordingly, when the first assumed value $P_1$ is evaluated to be smaller than the current value $P_0$ ($P_1<P_0$) in this step, the power consumed by the fan unit 3 can be reduced as compared to the current situation by closing the opening-closing portion 5. Therefore, the control unit 20 closes the opening-closing portion 5 when the relation is evaluated as $P_1<P_0$.

On the other hand, the second assumed value $P_2$ is the assumed value of the power consumed by the fan unit 3, which is assumed in the case of opening the opening-closing portion 5. Accordingly, when the second assumed value $P_2$ is evaluated to be smaller than the current value $P_0$ ($P_2<P_0$) in this step, the power consumed by the fan unit 3 can be reduced as compared to the current situation by opening the opening-closing portion 5. Therefore, the control unit 20 opens the opening-closing portion 5 when the relation is evaluated as $P_2<P_0$.

FIG. 9 schematically illustrates the contents of the processing in step S5. In FIG. 9, the first database 31 and the second database 32 are schematically illustrated in tables, respectively.

As described previously, the first database 31 is formed by relating the first assumed value $P_1$ of the power consumed by the fan unit 3 to the temperature T of the outside air A and the representative value $\varphi$ of the operating rates of the electronic devices 6.

The second database 32 is formed by relating the second assumed value $P_2$ of the power consumed by the fan unit 3 to the temperature T, the degree $\theta$ of the aperture, and the representative value $\varphi$. However, in FIG. 9, only the temperature T and the representative value $\varphi$ are set as the entries of the table, whereas the degree $\theta$ of the aperture is omitted. The reason for omitting the degree $\theta$ of the aperture is to formally conform the style of the table to that of the first database 31.

As illustrated in the first database 31 of FIG. 9, when the current temperature T is 19° C. and the representative value $\varphi$ of the operating rate is 100%, the first assumed value $P_1$ is 0.735 kW. Therefore, when the opening-closing portion 5 is currently opened and the current value $P_0$ of the power consumed by the fan unit 3 is equal to or above 0.735 kW ($=P_1$), then the power is reduced as compared to the current situation by closing the opening-closing portion 5.

Moreover, according to the second database 32, when the current temperature T is 19° C. and the representative value $\varphi$ of the operating rate is 100%, the second assumed value $P_2$ is 0.703 kW. Therefore, when the opening-closing portion 5 is currently closed and the current value $P_0$ of the power consumed by the fan unit 3 is equal to or above 0.703 kW ($=P_2$), then the power is reduced as compared to the current situation by opening the opening-closing portion 5.

Likewise, when the current temperature T is 22° C. and the representative value $\varphi$ of the operating rate is 100%, the opening or closing of the opening-closing portion 5 is determined by comparing the current value $P_0$ of the power consumed by the fan unit 3 with the first assumed value $P_1$ (0.804 kW) and the second assumed value $P_2$ (0.864 kW).

Thereafter, the determination of the opening or closing of the opening-closing portion 5 in step S5 is continuously conducted by repeating the above-described control at time intervals of several seconds, so that the power consumption of the modular data center 1 is reduced.

Up to this, the basic steps of the controlling method of the modular data center 1 of this embodiment are completed.

According to the above-described embodiment, the opening-closing portion 5 is opened and closed in step S5 by comparing the current value $P_0$ of the power consumed by the fan unit 3 with the assumed values $P_1$ and $P_2$ thereof. Thus, it is possible to open or close the opening-closing portion 5 quickly while forecasting future situations.

Moreover, since the determination to open or close the opening-closing portion 5 is made with reference to the first and second databases 31 and 32, it is not necessary to measure the power consumed by the fan unit 3 after actually opening or closing the opening-closing portion 5. Thus, the determination to open or close the opening-closing portion 5 can be made promptly.

Particularly, by using the representative value $\varphi$ of the operating rates of the electronic devices 6 for the entry in the databases 31 and 32, it is possible to quickly cool the electronic device 6 such as a server, in which the air volume of the cooling wind B required for cooling to the specified temperature $T_s$ varies depending on the operating rate.

(Experimental Results)

Next, experiments conducted by the inventors of the present application will be described.

In FIG. 2, the lower limit temperature $T_1$ of the operation guarantee region S is employed as one of threshold temperatures used for opening the opening-closing portion 5.

An investigation has been conducted in order to investigate how much of the operation region Q to open the opening-closing portion 5 spreads to a high-temperature side by operating the data center 1 in accordance with the present embodiment.

Here, the dimensions of the container 2 used for the investigation include a depth of 3474.6 mm, a width of 2331.6 mm, and a height of 2769.7 mm. Moreover, the opening-closing portion 5 is hypothesized to exhibit the degree θ of the aperture of either 0% or 100% only.

Figure 10:
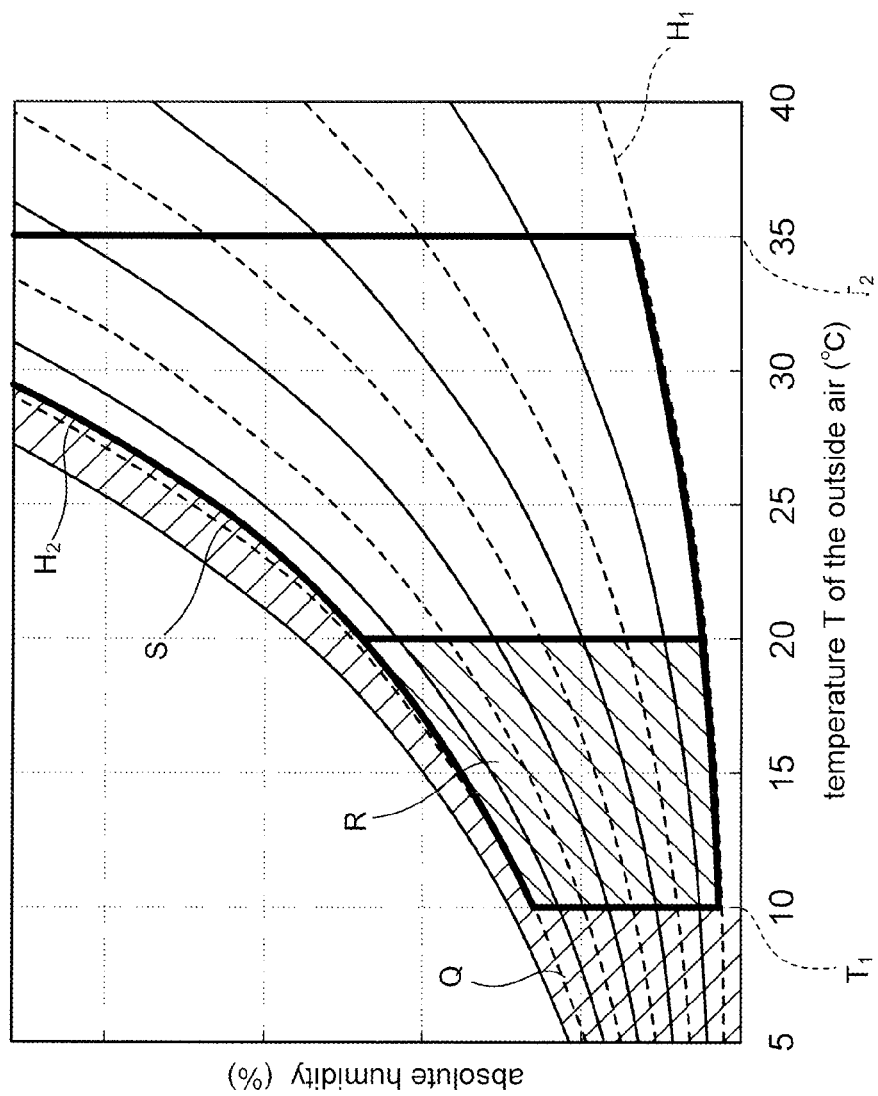
FIG. 10 is a graph illustrating an operation region when the modular data center is operated in accordance with the embodiment.

FIG. 10 is a graph illustrating the operation region Q when the modular data center 1 is operated in accordance with the present embodiment under the above-mentioned conditions. Note that the elements explained with reference to FIG. 2 are denoted by the same reference numerals as those in FIG. 10 and descriptions thereof will be omitted hereinbelow.

As illustrated in FIG. 10, the operation region Q to open the opening-closing portion 5 was successfully expanded to a region R by operating the modular data center 1 in accordance with the present embodiment.

The region R is a region where it is possible to reduce the power consumed by the fan unit 3 by opening the opening-closing portion 5 as compared to the case of closing the opening-closing portion 5. In this example, it was made clear that the power consumed by the fan unit 3 could be reduced by opening the opening-closing portion 5 even when the temperature T of the outside air A was around 20° C.

The above-described effect of reducing the power becomes more prominent as the temperature T is lower. For example, when the temperature T was equal to 10.5° C., it was confirmed that the power consumed by the fan unit 3 was reduced by 21.9% as compared to the case of opening the opening-closing portion 5 on the basis of the lower limit temperature $T_1$ as in FIG. 2.

In addition, the inventors of the present application also investigated how much of the electrical energy of the fan unit 3 could be reduced in one year by operating the data center 1 in accordance with the present embodiment.

Figure 11:
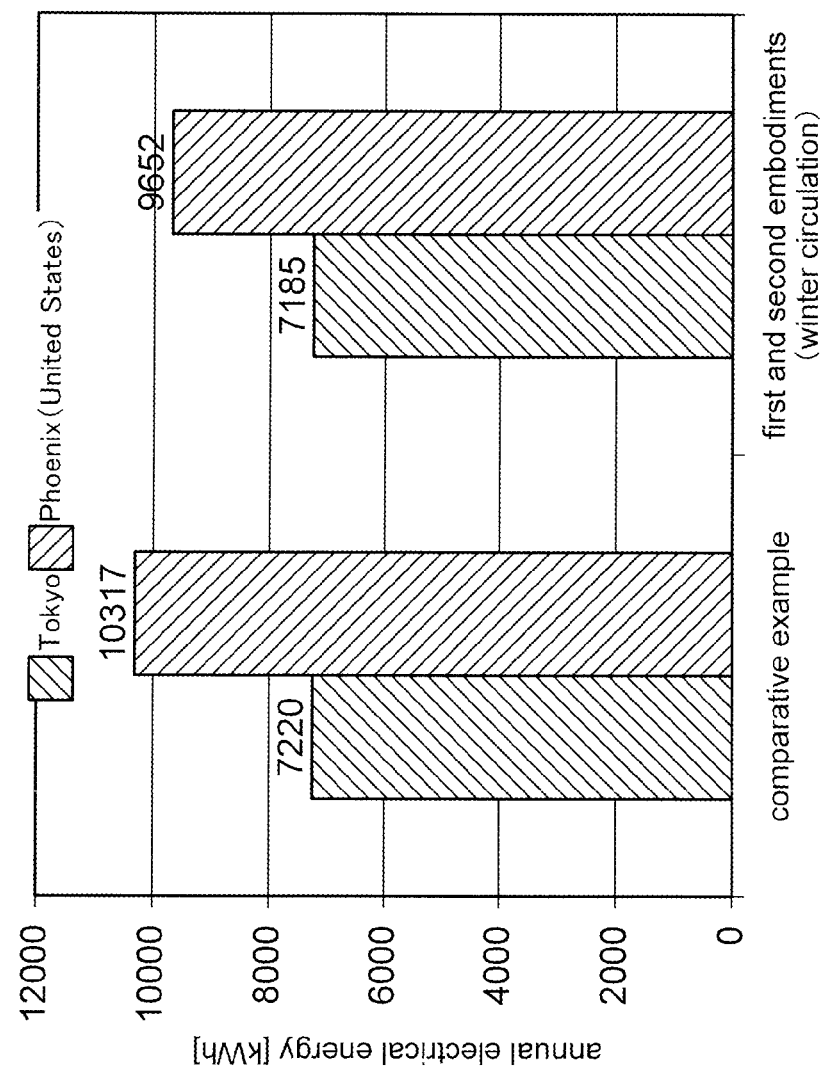
FIG. 11 is a graph illustrating a result of an investigation to investigate how much of the electrical energy of the fan unit of the modular data center according to the embodiment can be reduced in one year.

FIG. 11 illustrates a result of this investigation.

In this investigation, annual electrical energy of the fan unit 3 was estimated for the cases of installing the modular data center 1 in Tokyo located in humid subtropical climate and in Anchorage US located in humid subarctic climate, respectively.

In an area such as Anchorage where the temperature is low, the opening-closing portion 5 is thought to be opened for a longer period of time than in Tokyo in order to warm the cooling wind B with the exhaust flow E.

In the comparative examples where the opening-closing portion 5 is opened on the basis of the lower limit temperature $T_1$ as in FIG. 2 while not applying the embodiment, the annual periods for opening the opening-closing portion 5 were 2737 hours in Tokyo and 6110 hours in Anchorage.

On the other hand, when the modular data center 1 was operated in accordance with the present embodiment, the periods for opening the opening-closing portion 5 were increased by 2867 hours in Tokyo and 2641 hours in Anchorage. In the present embodiment, the opening-closing portion 5 is opened only when it is determined that the power consumed by the fan unit 3 can be reduced more than the current situation as described previously. Accordingly, when the periods for opening the opening-closing portion 5 become longer in this manner, the reduction effects on the fan unit 3 are deemed to be improved more.

As a consequence, as illustrated in FIG. 11, annual reduction amounts of the electrical energy of the fan unit 3 were 303 kWh in Tokyo and 1024 kWh in Anchorage, respectively. Thus, it was revealed that the electrical energy of the fan unit 3 can be reduced by 4.2% in Tokyo and by 17.9% in Anchorage in one year.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A modular data center comprising:
    an enclosure including an intake port and an exhaust port;
    a fan provided in the enclosure and configured to create a cooling wind by taking in outside air from the intake port;
    a plurality of electronic devices provided in the enclosure and configured to take in the cooling wind and to discharge an exhaust flow created from the taken cooling wind to the exhaust port;
    a flow passage guiding a part of the exhaust flow to upstream of the fan;
    an opening-closing portion configured to open and close the flow passage; and
    a control unit configured to adjust an air volume of the cooling wind by controlling the fan, and thereby to cool a temperature of each electronic device to a specified temperature,
    wherein the control unit executes:
    closing the opening-closing portion when a first assumed value of power consumed by the fan assumed to be consumed in a case of bringing the temperature of the electronic device to the specified temperature by using the cooling wind while closing the opening-closing portion is smaller than a current value of the power, and
    opening the opening-closing portion when a second assumed value of the power consumed by the fan assumed to be consumed in a case of bringing the temperature of the electronic device to the specified temperature by using the cooling wind while opening the opening-closing portion is smaller than the current value of the power.

2. The modular data center according to claim 1, wherein the control unit executes:
    referring to a first database formed by relating the first assumed value to a representative value of operating rates of the plurality of electronic devices and a temperature of the outside air, and thus to obtain the first assumed value corresponding to the representative value and the temperature in a current situation, and
    determining whether to open or close the opening-closing portion by using the first assumed value.

3. The modular data center according to claim 1, wherein the control unit executes:
    referring to a second database formed by relating the second assumed value to the representative value of the operating rates of the plurality of electronic devices, a degree of an aperture of the opening-closing portion, and a temperature of the outside air, and thus to obtain the second assumed value corresponding to the representative value, the degree of the aperture, and the temperature in a current situation, and
    determining whether to open or close the opening-closing portion by using the second assumed value.

4. The modular data center according to claim 3, wherein the second database is corrected in consideration of a temperature rise of the cooling wind assumed to occur in the case of opening the opening-closing portion.

5. The modular data center according to claim 3, wherein the second database is corrected in consideration of a change in static pressure of the fan assumed to occur in the case of opening the opening-closing portion.

6. The modular data center according to claim 1, characterized in that the control unit executes:
referring to a third database formed by relating the second assumed value to a representative value of operating rates of the plurality of electronic devices, a degree of an aperture of the opening-closing portion, a temperature of the outside air, and a static pressure of the fan, and thus to obtain the second assumed value corresponding to the representative value, the degree of the aperture, the temperature, and the static pressure in a current situation, and
determining whether to open or close the opening-closing portion by using the second assumed value.

7. The modular data center according to claim 6, wherein the third database is corrected in consideration of a temperature rise of the cooling wind assumed to occur in the case of opening the opening-closing portion.

8. The modular data center according to claim 1, wherein the modular data center comprises:
a first room provided between the intake port and the fan in the enclosure;
a second room provided between the fan and the electronic device in the enclosure, where the cooling wind flowing through the second room; and
a third room provided between the electronic device and the exhaust port in the enclosure, where the exhaust flow flowing through the third room, wherein
the flow passage is connected to the first room and the third room, and
the flow passage is isolated from the second room by a partitioning member.

9. The modular data center according to claim 8, wherein the enclosure comprises a first side face and a second side face opposed to each other,
the first room, the second room, and the third room share the first side face and the second side face, and
a ceiling of the second room is defined by the partitioning member.

10. A controlling method of a modular data center, the method comprising:
creating a cooling wind from outside air by using a fan;
cooling a plurality of electronic devices by causing each electronic device to take in the cooling wind;
guiding part of an exhaust flow discharged from the electronic device as a consequence of taking in the cooling wind to upstream of the fan through a flow passage provided with an opening-closing portion;
acquiring a current value of power consumed by the fan;
calculating a first assumed value of the power consumed by the fan assumed to be consumed in a case of bringing a temperature of the electronic device to a specified temperature by using the cooling wind while closing the opening-closing portion;
calculating a second assumed value of the power consumed by the fan assumed to be consumed in a case of bringing the temperature of the electronic device to the specified temperature by using the cooling wind while opening the opening-closing portion;
closing the opening-closing portion when the first assumed value is smaller than the current value; and
opening the opening-closing portion when the second assumed value is smaller than the current value.

11. The controlling method of a modular data center according to claim 10, wherein the calculating of the first assumed value includes referring to a first database formed by relating the first assumed value to a representative value of operating rates of the plurality of electronic devices and a temperature of the outside air, and thus obtaining the first assumed value corresponding to the representative value and the temperature in a current situation.

12. The controlling method of a modular data center according to claim 10, wherein the calculating of a second assumed value includes referring to a second database formed by relating the second assumed value to a representative value of operating rates of the plurality of electronic devices, a degree of an aperture of the opening-closing portion, and a temperature of the outside air, and thus obtaining the second assumed value corresponding to the representative value, the degree of the aperture, and the temperature in a current situation.

13. The controlling method of a modular data center according to claim 12, wherein the second database is corrected in consideration of a temperature rise of the cooling wind assumed to occur in the case of opening the opening-closing portion.

14. The controlling method of a modular data center according to claim 12, wherein the second database is corrected in consideration of a change in static pressure of the fan assumed to occur in the case of opening the opening-closing portion.

15. The controlling method of a modular data center according to claim 10, wherein the calculating of a second assumed value includes referring to a third database formed by relating the second assumed value to a representative value of operating rates of the plurality of electronic devices, a degree of an aperture of the opening-closing portion, a temperature of the outside air, and a static pressure of the fan, and thus obtaining the second assumed value corresponding to the representative value, the degree of the aperture, the temperature, and the static pressure in a current situation.

16. The controlling method of a modular data center according to claim 15, wherein the third database is corrected in consideration of a temperature rise of the cooling wind assumed to occur in the case of opening the opening-closing portion.

* * * * *